(12) United States Patent
Shibuya et al.

(10) Patent No.: US 10,729,047 B2
(45) Date of Patent: Jul. 28, 2020

(54) AUTOMATIC SPLICING DEVICE

(71) Applicant: FUJI CORPORATION, Chiryu-shi (JP)

(72) Inventors: Masato Shibuya, Okazaki (JP); Daisuke Nakamura, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 334 days.

(21) Appl. No.: 15/555,217

(22) PCT Filed: Mar. 31, 2015

(86) PCT No.: PCT/JP2015/060215
§ 371 (c)(1),
(2) Date: Sep. 1, 2017

(87) PCT Pub. No.: WO2016/157437
PCT Pub. Date: Oct. 6, 2016

(65) Prior Publication Data
US 2018/0042150 A1    Feb. 8, 2018

(51) Int. Cl.
*B23P 19/00* (2006.01)
*H05K 13/02* (2006.01)
*H01L 21/68* (2006.01)
*H05K 3/30* (2006.01)

(52) U.S. Cl.
CPC ......... *H05K 13/021* (2013.01); *H01L 21/681* (2013.01); *H05K 3/301* (2013.01); *H05K 13/0215* (2018.08); *H01L 2221/68322* (2013.01); *H05K 2203/163* (2013.01); *Y10T 29/53174* (2015.01)

(58) Field of Classification Search
CPC ........... H05K 13/0417; H05K 13/0419; H05K 13/02; H05K 13/086; B65H 21/00; B65H 2301/4631; B65H 19/1805; B65H 2701/11332; Y10T 29/53178; Y10T 29/53261; Y10T 29/53174; G03D 13/005
USPC .......... 29/739, 720, 721, 740, 741, 742, 832
See application file for complete search history.

(56) References Cited

U.S. PATENT DOCUMENTS 9,731,922 B2 * 8/2017 Chi .................... B65H 23/1886

FOREIGN PATENT DOCUMENTS

| JP | 04-243757 A | 8/1992 |
| JP | 4349345 B2 | 10/2009 |

OTHER PUBLICATIONS

International Search Report dated Jul. 7, 2015 in PCT/JP2015/060215, filed on Mar. 31, 2015.

* cited by examiner

*Primary Examiner* — Thiem D Phan
(74) *Attorney, Agent, or Firm* — Oblon, McClelland, Maier & Neustadt, L.L.P.

(57) ABSTRACT

An automatic splicing device provided with a communication device configured to communicate with a component mounter or a host computer that is connected to the component mounter such that communication is possible, a connection control device configured to control connecting of the a first tape and a second tape, and a display device configured to display information related to connecting of the first tape and the second tape.

2 Claims, 8 Drawing Sheets

AUTOMATIC SPLICING DEVICE

TECHNICAL FIELD

The present invention relates to an automatic splicing device for automatically connecting at a splicing position using splicing tape a first tape and a second tape each provided with indexing holes and component-storage cavities at a fixed interval, and to a component mounter for mounting components of tape connected by the automatic splicing device at component mounting positions on a board.

BACKGROUND ART

For example, an automatic splicing device disclosed in patent literature 1 is placed near a component mounter, and an operator inserts a leading end of carrier tape of the same type as a carrier tape at the component mounter about to run out of components into one side of the device and inserts the trailing end of the carrier tape at the component mounter about to run out of components into another side of the device. Then, the automatic splicing device cuts each of the carrier tapes at a specified location, and automatically connects the tapes at the cut locations using splicing tape.

Also, for example, disclosed in patent literature 2 is a component mounter that, during component supply operation using carrier tape connected using a range of a specified length of the connection position of the cut locations as empty cavities, when the connection position reaches a specified position on an upstream side of a component pickup position, feeds the carrier tape by exactly a specified length that is set in advance. The reason for providing empty cavities at the connection position is such that pickup of components is not performed at the connected position, due to the possibility of a pickup error occurring at the connection position in a case in which a tolerance error arises in the cut locations of the carrier tapes.

CITATION LIST

Patent Literature

Patent literature 1: JP-A-H4-243757
Patent literature 2: JP-A-4349345

SUMMARY OF INVENTION

Technical Problem

When using carrier tape connected by the automatic splicing device disclosed in patent literature 1 in the component mounter disclosed in patent literature 2, an operator must check, visually or otherwise, the quantity of empty cavities at the connection position of the connected carrier tapes and specify appropriate settings at the component mounter. Therefore, in a case in which an operator makes a mistake with the quantity of empty cavities, there is a danger of defective products occurring at the component mounter.

The present invention takes account of the above problems, and an object thereof is to provide an automatic splicing device and a component mounter capable of performing component mounting, having automatically set at the component mounter a quantity of empty cavities provided at a connection position when a first tape and a second tape are connected using the automatic splicing device.

Solution to Problem

Automatic Splicing Device
To solve the above problems, an automatic splicing device of the present invention is an automatic splicing device for automatically connecting at a splicing position using splicing tape a first tape provided with indexing holes and component storage cavities at a fixed interval and a second tape provided with indexing holes and component storage cavities at a fixed interval, the automatic splicing device including: a connection control device configured to control connecting of the first tape and the second tape and detect a quantity of empty cavities at a connection position of the first tape and the second tape; and a communication device configured to send the detected quantity of empty cavities to a component mounter or a host computer connected to the component mounter such that communication is possible.

With this automatic splicing device, it is possible to send a detected quantity of empty cavities at the connection position to a component mounter or the like. By this, at the component mounter, it is possible to perform component mounting having automatically set the sent quantity of empty cavities, thus preventing the occurrence of defective products.

Component Mounter
To solve the above problems, a component mounter is configured to consecutively pick up components from tape supplied by a component supply device, mount the components on a board, and perform control such that, when tape connected by the automatic splicing device of according to an embodiment of the present invention is supplied by the component supply device and the connection position of the tapes reaches a component pickup position, a tape feeding speed of the component supply device is made faster for a portion equivalent to the quantity of the empty cavities sent by the automatic splicing device.

With this component mounter, because it is possible to perform fast feeding of the empty cavities at the connection position that are not required for component mounting, component mounting efficiency is improved.

DESCRIPTION OF EMBODIMENTS

Overview of Configuration of Automatic Splicing Device

Figure 1:
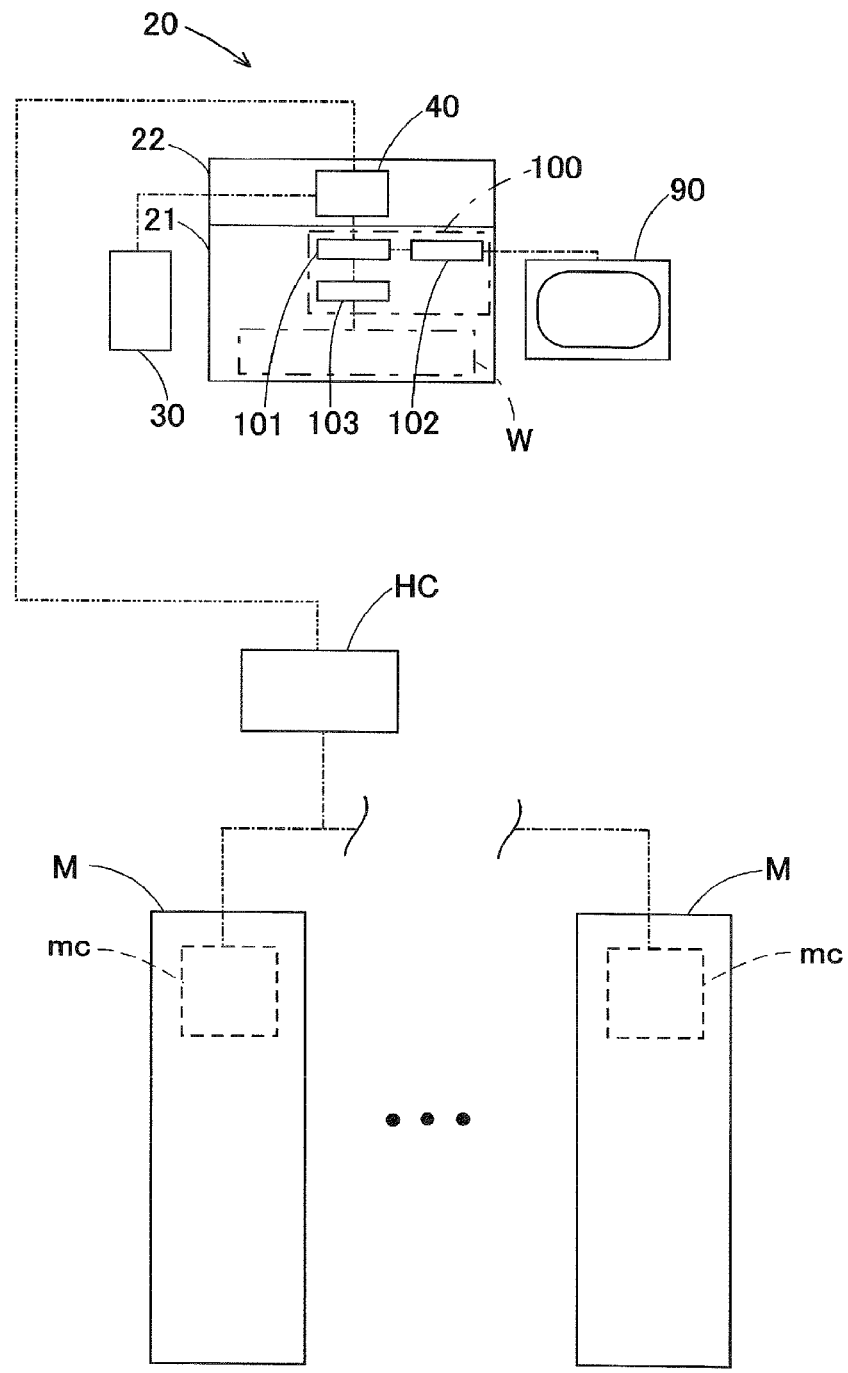
FIG. 1 shows an overview of the configuration of an automatic splicing device and component mounter of an embodiment.
Figure 2:
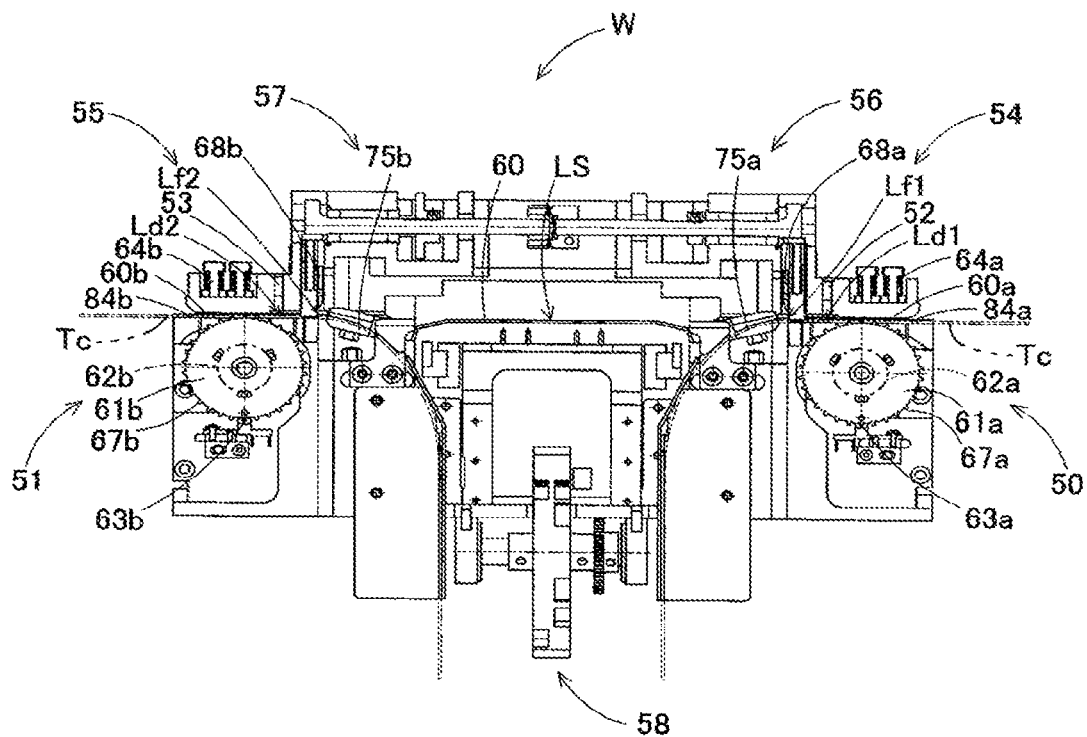
FIG. 2 shows the configuration of the tape connecting mechanism of the automatic splicing device.

An overview of the configuration of an automatic splicing device of an embodiment is described below with reference to the figures. As shown in FIG. 1, automatic splicing device 20, as described in detail later, is provided with reading device 30, communication device 40, display device 90, and control device 100, and, as shown in FIG. 2, is a device that includes tape connecting mechanism W configured from first and second tape indexing devices 50 and 51 and the like.

Figure 3A:
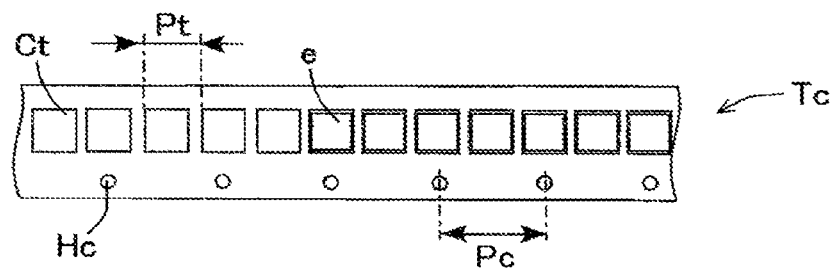
FIG. 3A is a plan view of carrier tape.
Figure 3B:
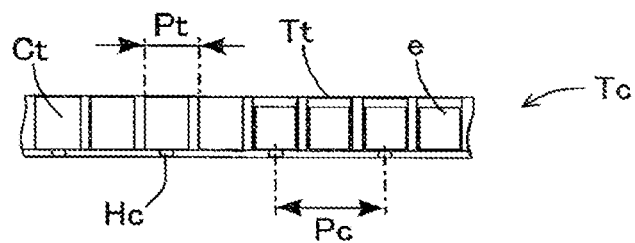
FIG. 3B is a view of the carrier tape of FIG. 3A seen from the side.

Automatic splicing device 20 indicates to an operator that components e stored in carrier tape Tc shown in FIGS. 3A and 3B used on component mounter M are going to run out by receiving an indication of such from component mounter M or host computer HC connected to component mounter M such that communication is possible via communication device 40 and displaying the indication on display device 90, and automatically connects a trailing end of carrier tape Tc for which the components are going to run out to a leading end of new carrier tape Tc using splicing tape. Automatic splicing device 20 is configured to be loaded on a cart or the like, not shown, and movable between multiple component mounters M, so as to be transported to a given component mounter M and perform connecting of tapes.

Figure 4:
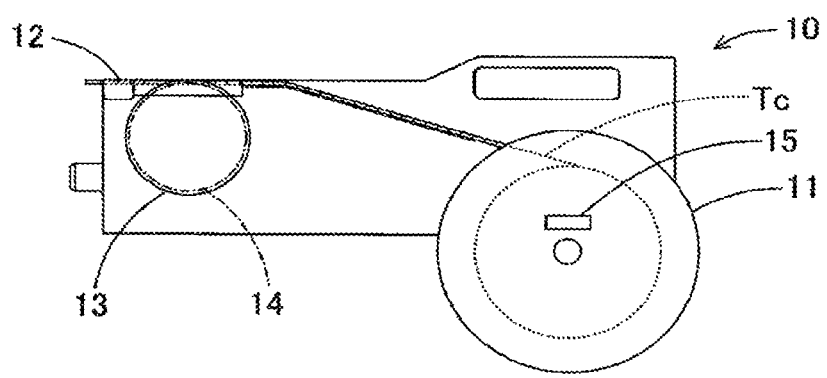
FIG. 4 shows a feeder to which a reel wound with carrier tape is detachably attached.

Here, component mounter M is a conventional mounter that feeds carrier tape Tc wound on reel 11 that is attached to tape feeder 10 (which corresponds to the "component supply device" of the present invention) shown in FIG. 4, and performs mounting by picking up component e from carrier tape Tc using a component transfer device, and transferring the picked up component e to a conveyed board. Multiple such component mounters M are lined up to configure a mounting line, and mounting control device mc that controls component mounting of each component mounter M performs communication of information such as mounting component information with host computer HC.

Also, as shown in FIGS. 3A and 3B, carrier tape Tc is long and thin with a specified width, and has multiple cavities Ct formed in a lengthwise direction at a specified pitch Pt. Each of these cavities Ct stores a component e to be mounted on a circuit board. An upper section of cavity Ct is open and is covered by top tape Tt that is affixed to an upper surface of carrier tape Tc. Indexing holes Hc are formed at a specified pitch Pc in a lengthwise direction at one edge in the widthwise direction of carrier tape Tc. Note that, in the present embodiment, carrier tape Tc that has a portion of multiple consecutive empty cavities Ct in which components e are not stored at a leading end thereof is used.

For carrier tape Tc, pitch Pt and the size of cavities Ct varies with the size of components e, but the size and pitch of Pc of indexing holes Hc is the same. Cavities Ct and indexing holes Hc are arranged with a fixed positional relationship, and carrier tape Tc is formed such that one cavity Ct each exists at a position the same as indexing hole Hc and at an intermediate point between adjacent indexing holes Hc, with a specified pitch Pt (=Pc/2).

As shown in FIG. 4, carrier tape Tc is wound on reel 11. Reel 11 is removably attached to tape feeder 10. Identifier 15 such as a barcode, on which is recorded tape identification information such as the type of component e stored in carrier tape Tc, is attached to reel 11. Provided in tape feeder 10 is tape indexing mechanism 13 for indexing carrier tape Tc wound around reel 11 by a fixed amount each time and supplying electronic components e one by one to component pickup position 12 provided at the tip section of tape feeder 10. Tape indexing mechanism 13 is rotatably provided on the main body of tape feeder 10, and is provided with sprocket 14 for engaging with indexing holes Hc of carrier tape Tc and a motor, not shown, for rotating sprocket 14.

Reading device 30 is, for example, a barcode reader that optically reads tape identification information of identifier 15 affixed to reel 11, and sends the information by a wire to communication device 40. Communication device 40 is connected by wire to reading device 30, and, for example, is a bridge-type device that communicates wirelessly with host computer HC that manages mounting control device mc of multiple component mounters M.

Display device 90 is, for example, a panel controller that displays various information such as tape identification information of identifier 15 and information related to mounting components e at component mounter M. Control device 100 controls reading device 30, communication device 40, display device 90, and tape connecting mechanism W, and is provided with communication control section 101, display control section 102, and connection performing section 103 (which corresponds to the "connecting control device" of the present invention).

Communication control section 101 controls communication of data between reading device 30 and host computer HC that is performed via communication device 40. Display control section 102 displays information such as tape identification information of identifier 15 received from reading device 30 via communication device 40, and information of component mounting at component mounter M received from host computer HC via communication device 40, which is data sent from communication control section 101, on display device 90 lined up in order of highest priority, for example, in order of which component is due to run out first.

Connection performing section 103 controls driving of tape connecting mechanism W based on a verification result of carrier tape Tc for which components are going to run out and identification information of new carrier tape Tc, received from host computer HC via communication device 40, which is data sent from communication control section 101. Also, connection performing section 103 detects the quantity of empty cavities Ct that exist at the connection position of carrier tape Tc that is going to run out and new carrier tape Tc, and sends the quantity to communication control section 101. Communication control section 101 sends the quantity of empty cavities detected by connection performing section 103 to host computer HC via communication device 40.

Configuration of tape connecting mechanism of automatic splicing device Described next is the configuration of tape connecting mechanism W of automatic splicing device 20. As shown in FIG. 2, arranged in housing 21 (refer to FIG. 1) of automatic splicing device 20 are: first and second tape indexing devices 50 and 51, first and second origin position detection devices 63a and 63b, first and second light amount detection devices 52 and 53, first and second cutting devices 54 and 55, first and second takeup devices 56 and 57, connecting device 58, control device 100 (see FIG. 1), and so on.

First and second tape indexing devices 50 and 51 are each arranged at both sides inside housing 21 and inside lid 22 (see FIG. 1). Further, first and second origin position detection devices 63a and 63b are each arranged below first and second sprockets 61a and 61b, described later, of first and second tape indexing devices 50 and 51; first and second light detection amount devices 52 and 53 are each arranged sandwiched between first and second detection positions Ld1 and Ld2 of first and second conveyance paths 60a and 60b, which are described later, of first and second tape indexing devices 50 and 51, facing opposite in a vertical direction.

First and second cutting devices 54 and 55 are respectively arranged at first and second cutting positions Lf1 and Lf2 between first and second indexing devices 50 and 51; first and second takeup devices 56 and 57 are respectively arranged between first and second cutting positions Lf1 and Lf2 between first and second cutting devices 54 and 55 and splicing position LS; connecting device 58 is arranged between first and second takeup devices 56 and 57.

First and second tape indexing devices 50 and 51 are provided with first and second conveyance paths 60a and 60b provided extending in a horizontal direction towards the center from both ends of housing 21, first and second sprockets 60a and 60b arranged below first and second conveyance paths 60a and 60b, first and second gear motors 62a and 62b connected to first and second sprockets 61a and 61b, first and second tape detection devices 64a and 64b arranged above first and second conveyance paths 60a and 60b, and so on.

First and second cutting devices 54 and 55 are provided with first and second cutters 68a and 68b at first and second cutting positions Lf1 and Lf2, a vertical driving mechanism, not shown, that moves first and second cutters 68a and 68b up and down, and so on. First and second cutting devices 54 and 55 are configured to cut unneeded carrier tape at a cutting location.

First and second takeup devices 56 and 57 are provided with first and second takeup members 75a and 75b provided between first and second cutting positions Lf1 and Lf2 and splicing position LS, a driving mechanism, not shown, that drives first and second takeup members 75a and 75b, and so on. First and second takeup devices 56 and 57 are configured to each be capable of taking up unneeded cut carrier tape Tc.

Connecting device 58 is provided between first cutting device 54 and second cutting device 55 and formed therein is conveyance path 60 which is a portion of first and second conveyance paths 60a and 60b. Connecting device 58 is configured to be capable of conveying carrier tapes Tc along conveyance path 60 and connecting the carrier tapes Tc for which the cut locations are aligned at splicing position LS which is at a central point of conveyance path 60.

In automatic splicing device 20, at the left and right sides of FIG. 2, two carrier tapes Tc to be spliced are each indexed at a specified pitch by first and second tape indexing devices 50 and 51, and information of each carrier tape Tc, that is, presence of carrier tape Tc, pitch Pt between adjacent cavities (also referred to as pitch Pt of cavities Ct), presence of a component e in cavity Ct (also referred to as component-storing cavity Ct or empty cavity Ct), and the like, is detected.

Then, leaving a specified quantity of empty cavities Ct among the consecutive empty cavities Ct at the leading end of the carrier tape, the leading portions of the carrier tapes are respectively cut by first and second cutters 68a and 68b of first and second cutting devices 54 and 55, and the cut portions are respectively taken up by first and second takeup members of first and second takeup devices 56 and 57. And, protective tape affixed to splicing tape, not shown, that connects the two carrier tapes Tc is indexed in a direction perpendicular to the indexing direction of the carrier tapes Tc, and the cut ends of the two carrier tapes Tc are connected to each other in connecting device 58 using the splicing tape.

Operation of Automatic Splicing Device

Next, operation of control device 100 of automatic splicing device 20 is described with reference to the flowchart of FIG. 5. Host computer HC identifies the component mounter M with a reel 11 for which components are going to run out from component mounter information and so on sent from mounting control device mc of each component mounter M, and sends mounter identification information of the component mounter M and component identification information of the component that is going to run out to control device 100 of splicing device 20.

Figure 5:
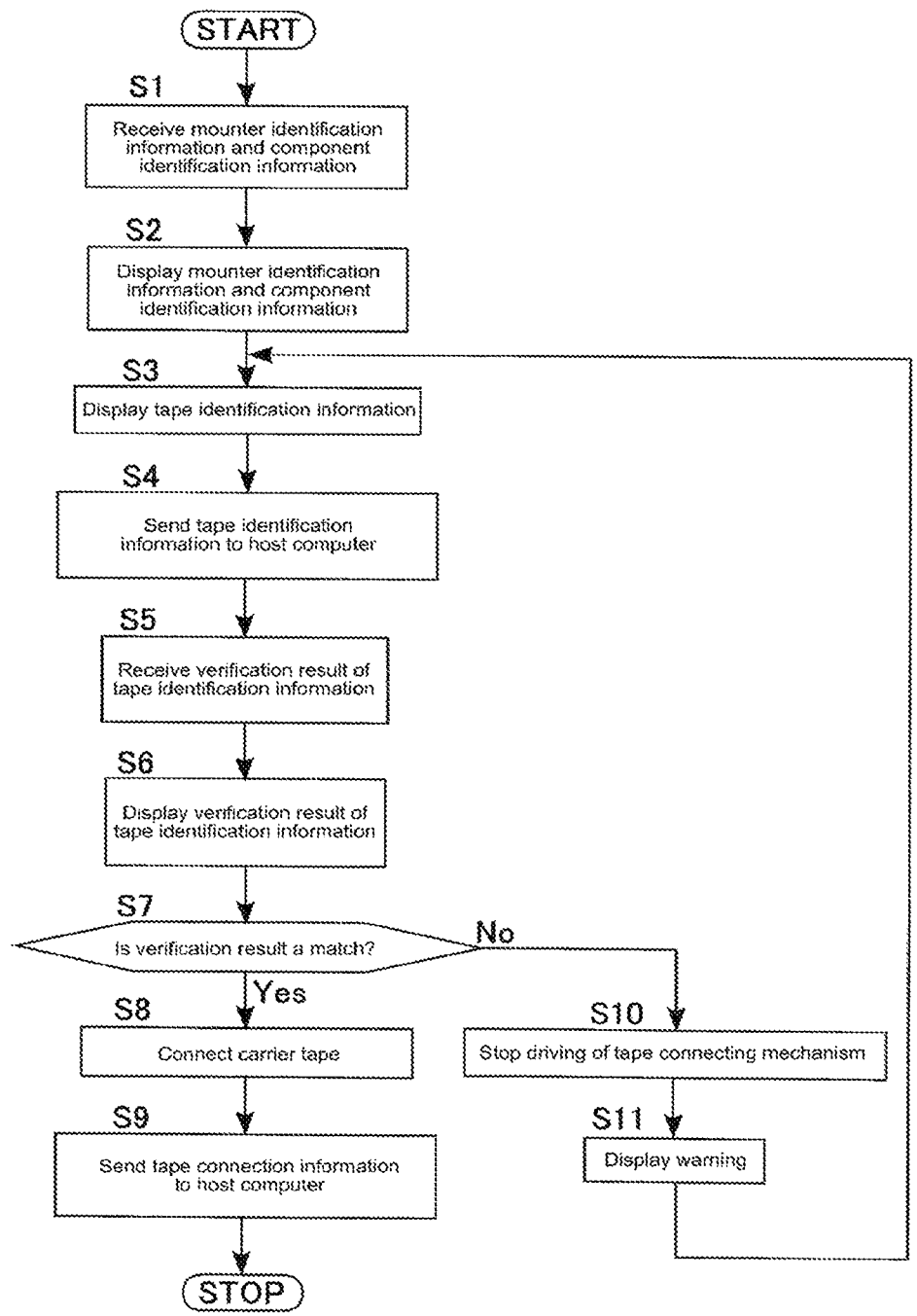
FIG. 5 is a flowchart for illustrating operation of the automatic splicing device.

Control device 100 displays the mounter identification information of the component mounter M and the component identification information of the component that is going to run out received from host computer HC on display device 90 (steps S1 and S2 of FIG. 5). Specifically, communication control section 101 mounter identification information such as the name of component mounter M received from host computer HC and component identification information such sa the name and part number of component e to display control section 102. Then, display control section 102 displays the mounter identification information and component identification information on display device 90, and in a case in which there are multiple component mounters M for which a component is going to run out, or in a case in which there are multiple tape feeders 10 for which components are going to run out in the same component mounter M, displays the information on display device 90 in order of highest priority, for example, in order of which component is due to run out first.

An operator looks at display device 90 and checks the mounter identification information and component identification information of components that are going to run out and moves a reel 11 wound with carrier tape Tc that stores the appropriate component e and automatic splicing device 20 to the appropriate component mounter M using the cart. Then, the operator removes reel 11 from the tape feeder 10 on which is loaded the reel 11 for which components are going to run out. Then, the operator uses reading device 30 to read the tape identification information such as the part number and name of component e of each identifier of reel 11 removed from tape feeder 10 and moved reel 11.

Control device 100 displays the tape identification information of each reel 11 read using reading device 30 on display device 90 (step S3 of FIG. 5), and sends the tape identification information to host computer HC (step S4 of FIG. 5). Specifically, communication control section 101 sends the tape identification information of each reel 11 received from reading device 30 to display control section 102 and sends the tape identification information to host computer HC via communication section 40. Then, display control section 102 displays the tape identification information of each reel 11 on display device 90. Also, host computer HC, after receiving the tape identification information of each reel 11, verifies the tape identification information, and sends the verification result to communication control section 101 via communication device 40.

Control device 100 causes display device 90 to display the verification result of the tape identification information received from host computer HC (steps S5 and S6 of FIG. 5). Specifically, communication control section 101 sends the verification result of the tape identification information received from host computer HC to display control section 102. Then, display control section 102 displays the verification result on display device 90.

An operator, after looking at display device 90 to confirm that the carrier tapes match, inserts the trailing end of carrier tape Tc of the reel 11 removed from tape feeder 10 and the leading end of carrier tape Tc of moved reel 11 into both sides of housing 21 of automatic splicing device 20.

Control device 100 determines whether the verification result indicates a match (step S7 of FIG. 5), and in the case in which it is determined that the verification result indicates a match, performs control to drive tape connecting mechanism W and connect the two inserted carrier tapes Tc (step S8 of FIG. 5), and sends tape connection information to host computer HC (step S9 of FIG. 5). Specifically, communication control section 101 sends the verification result of the tape identification information received from host computer HC to connection performing section 103. Then, connection performing section 103, if the verification result is determined to indicate a match, performs control to drive tape connecting mechanism W to connect the two inserted carrier tapes Tc, detecting the quantity of empty cavities Ct at the connection position, and sending the quantity to communication control section 101. Communication control section 101 sends the quantity of empty cavities Ct to host computer HC via communication device 40.

An operator, after completing connection of carrier tapes Tc, removes the connected carrier tape Tc from automatic splicing device 20, and loads reel 11 on tape feeder 10.

Host computer HC, after receiving the quantity of empty cavities Ct from communication device 40, sends the quantity of empty cavities Ct to mounting control device mc of the appropriate component mounter M. Mounting control device mc of component mounter M, after the connection position of carrier tapes Tc indexed from tape feeder 10 has reached the component pickup position, performs control such that high speed tape indexing is performed at tape feeder 10 for a portion corresponding to the quantity of empty cavities Ct received from host computer HC. Then, when the empty cavities Ct have passed the component pickup position, the indexing speed of tape feeder 10 is returned to the original indexing speed and component mounting continues.

On the other hand, in step S7, in a case in which control device 100 determines that the verification result indicates no match, without driving tape connecting mechanism W (step S10 in FIG. 5), a warning to stop connection is displayed on display device 90 (step S11 in FIG. 5), and processing returns to step S3. Specifically, connection performing section 103, if the verification result is determined to indicate no match, without driving tape connecting mechanism W, sends a warning to stop connection to display control section 102. Then, display control section 102 displays a warning to stop connection on display device 90.

An operator, after looking at display device 90 to confirm the warning to stop connection due to the verification result indicating no match, checks reels 11 and so on, and after performing countermeasures such as reel exchange, re-reads the tape identification information using reading device 30 and repeats the above processing.

Detection of Empty Cavities at Automatic Splicing Device

Figure 6:
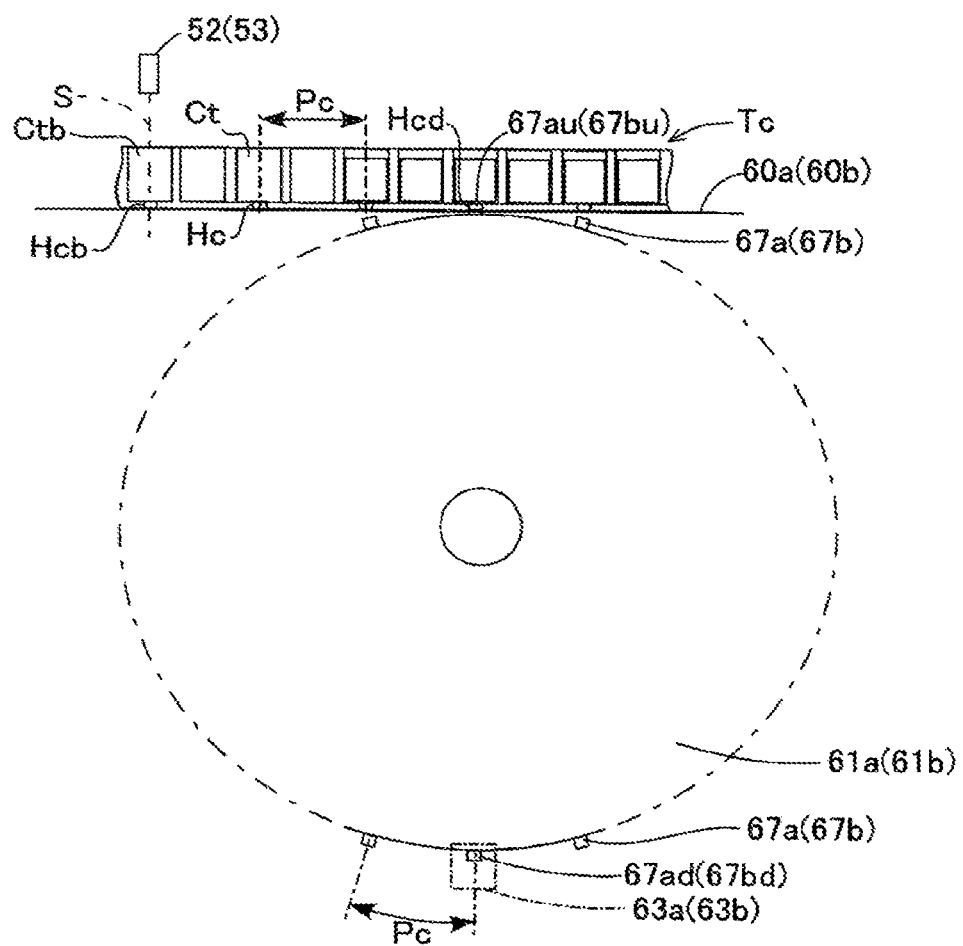
FIG. 6 shows the arrangement of first and second sprockets, first and second origin position detection devices, and first and second light amount detection devices, and indexing of carrier tape.

Next, detection of empty cavities at automatic splicing device 20 is described with reference to FIG. 6. Multiple first and second teeth 67a and 67b are provided around the circumferential edge of first and second sprockets 61a and 61b at a pitch the same as pitch Pc of indexing holes Hc of carrier tape Tc. In the present embodiment, first and second teeth 67a and 67b are formed at an interval the same or larger than the indexing pitch of carrier tape Tc. First and second sprockets 61a and 61b are arranged below first and second conveyance paths 60a and 60b such that first and second teeth 67au and 67bu rotated to be the uppermost of the first and second teeth 67a and 67b and indexing holes Hcd of carrier tapes Tc inserted along first and second conveyance paths 60a and 60b are engageable.

First and second tape detecting devices 64a and 64b detect that carrier tapes Tc have been inserted. First and second origin position detection devices 63a and 63b detect one of first and second teeth 67a and 67b from the multiple first teeth 67a and 67b of first and second sprockets 61a and 61b. In the present embodiment, the positions of the multiple first and second teeth 67a and 67b of first and second sprockets 61a and 61b are defined as the origin positions of first and second tape indexing devices 50 and 51 respectively. Therefore, first and second origin position detection devices 63a and 63b are sensors that detect multiple origin positions of first and second tape indexing devices 50 and 51 respectively.

Then, first and second origin position detection devices 63a and 63b are arranged such that when the first and second teeth 67ad and 67bd (origin positions) rotated to the lowermost of the first and second teeth 67a and 67b are detected, first and second teeth 67au and 67bu rotated to be the uppermost of the first and second teeth 67a and 67b and indexing holes Hcd of carrier tapes Tc inserted along first and second conveyance paths 60a and 60b are engaged.

First and second light amount detection devices 52 and 53 detect the amount of light that passes through cavity Ct of carrier tape Tc indexed by first and second sprockets 61a and 61b. The light amount detected by first and second light amount detection devices 52 and 53, when not passing through carrier tape Tc, that is, in a saturated state, indicates maximum value Lmax, and for an empty cavity Ct indicates a value smaller than specified value La. Also, value Lb smaller than the above specified value La is set as a threshold and, when the detected amount is smaller than La (<La), thus determines the tape portion between adjacent cavities Ct and component-storing cavities Ct.

Here, the detection positions (positions of sensor light axis S) of first and second light amount detection devices 52 and 53 are arranged such that when first and second teeth 67ad and 67bd (origin positions) of first and second sprockets 61a and 61b are detected at first and second origin position detection devices 63a and 63b indexing holes Hcb of carrier tape Tc and cavities Ctb formed at the same position are aligned at the same position, that is, are arranged such that the amount of light passing through cavity Ctb can be detected.

In the present embodiment, because the position at which cavity Ctb and indexing hole Hcb at the same position are detected by first and second light amount detection devices 52 and 53 is defined as the tape reference position (position of indexing hole Hcb) of carrier tape Tc, the origin position of first and second tape indexing devices 50 and 51 (position of first and second teeth 67ad and 67bd) has a fixed positional relationship with the reference position (position of indexing hole Hcb) of carrier tape Tc. Thus, a tape reference position with a fixed positional relationship to a first origin position is decided based on a first origin position of first and second tape indexing devices directly before detection of the leading end and first position of first and second tape indexing devices 50 and 51 when the detection signal of the leading end of carrier tape Tc is received.

Operation for deciding the tape reference position based on the first position and first origin position is described next with reference to FIGS. 8 to 10. Note that, because operation for deciding the tape reference position is the same for carrier tape Tc inserted into both sides of automatic splicing device 20, described in the following is only operation for deciding the tape reference position for carrier tape Tc inserted from the right side in FIG. 2. Also, in the present embodiment, as shown in FIG. 8, tape leading end Th of carrier tape Tc is taken as a portion of tape between cavity Ct of indexing hole Hc and cavity Ct adjacent to that cavity Ct as shown by the hypothetical line (single-dot dashed line).

Figure 7:
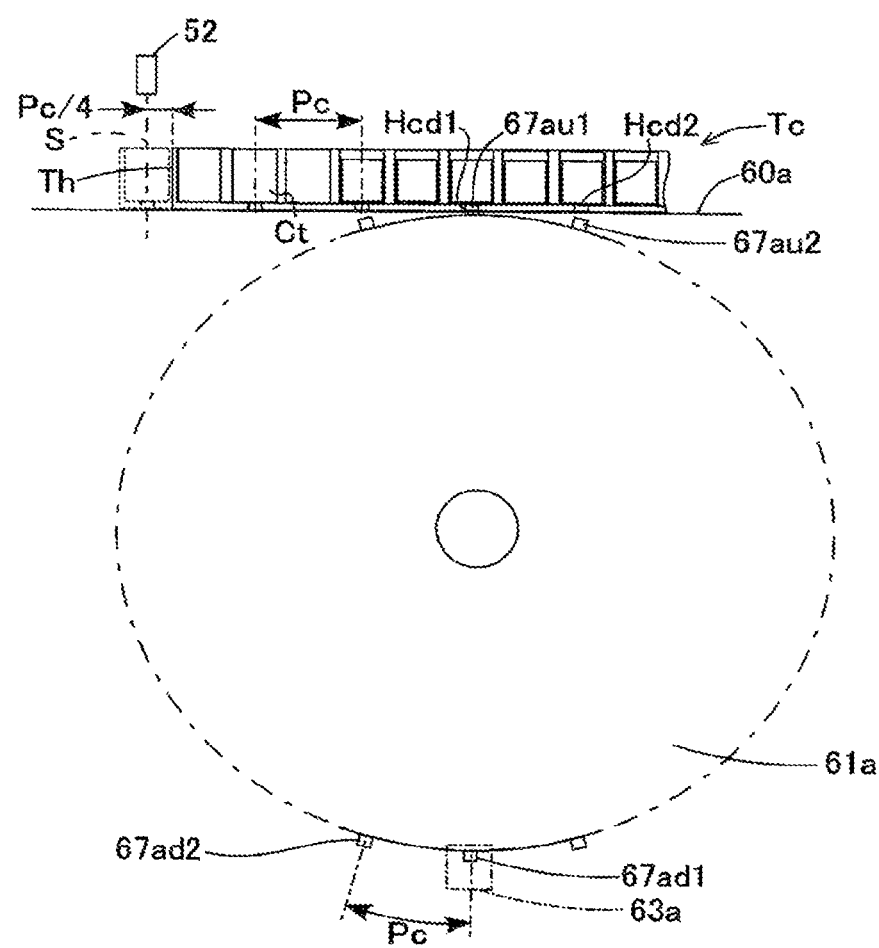
FIG. 7 shows a detection state of the first origin position of first tape indexing device immediately before leading end detection, and the first sprocket and carrier tape in this state.

FIG. 7 shows a state of detection of the first origin position immediately before detection of the leading end of carrier tape Tc. In this state, when lowermost first tooth 67ad1 of first sprocket 61a is detected by first origin position detection device 63a, that is, when the position of tape leading end Th of carrier tape Tc when uppermost first tooth 67au1 of first sprocket 61a and indexing hole Hcd1 of carrier tape Tc are engaged is separated from the detection position (position of sensor light axis S) of first light amount detection device 52 by a quarter of a pitch (Pc/4) to the conveyance upstream side. Note that, descriptions are given below with first tooth 67a detected after first tooth 67ad1 designated as 67ad1, and first tooth 67au1 to engage with indexing hole Hcd2 next designated as 67au1.

Figure 8:
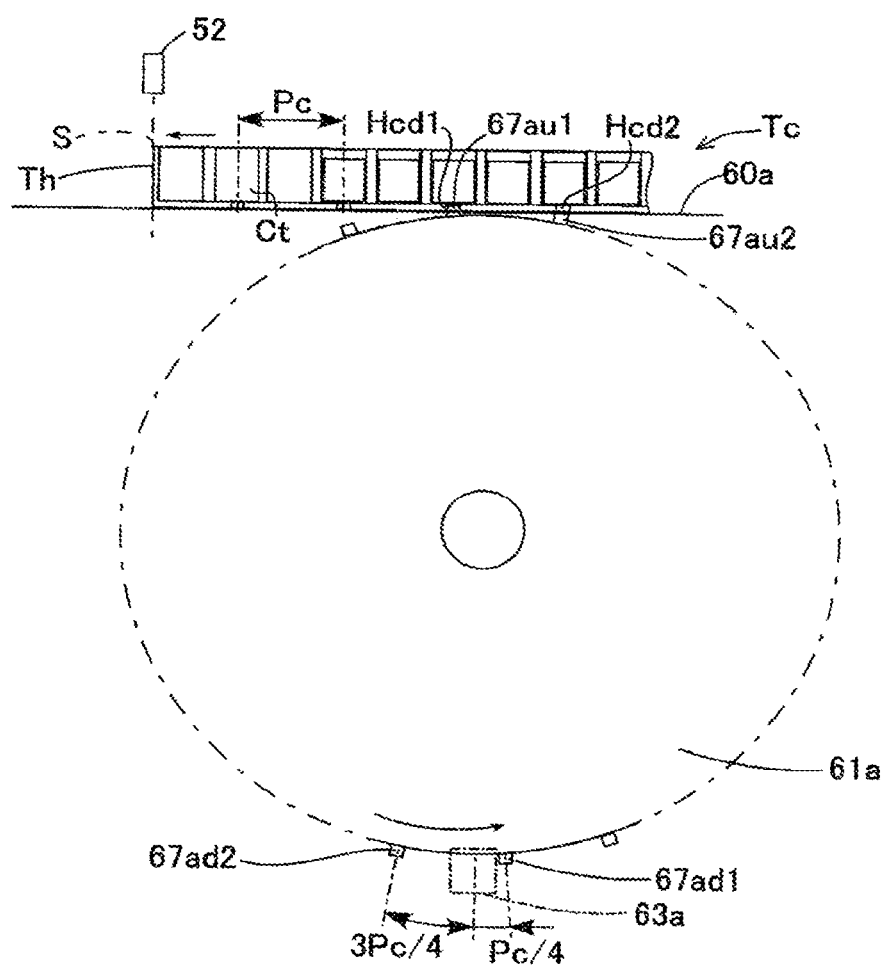
FIG. 8 shows a leading end detection state, and the first sprocket and carrier tape in this state.

FIG. 8 shows a state of detection of the leading end of carrier tape Tc. That is, first sprocket 61a is rotated distance Pc/4 from the detection state (detection of first sprocket 67ad1) of the first origin position of FIG. 7, such that carrier tape Tc is advanced by distance Pc/4, and tape leading end Th has reached the detection position (position of sensor light axis S) of first light amount detection device 52). The position of first tooth 67ad1 at this time is taken as the first position.

The reference position is decided by calculating the indexing amount of carrier tape Tc from the first origin position to the first position, that is, distance Pc/4, from the first origin position, that is, the position at which first tooth 67ad1 is detected by first origin position detection device 63a, and the first position, that is, the position rotated distance Pc/4 from the position at which first tooth 67ad1 is detected by first origin position detection device 63a. And, the gap between adjacent origin positions, that is, the difference between distance Pc and indexing amount of carrier tape Tc from the first origin position to the first position, that is, distance Pc/4 is calculated; that is, distance 3Pc/4, is calculated. Further, the position of cavity Ct of carrier tape Tc positioned at the detection position (position of sensor light axis S) of first light amount detection device 52 and indexing hole Hc at the same position when carrier tape Tc has been indexed by calculated distance 3Pc/4 from the state shown in FIG. 9 is decided as the tape reference position with a fixed positional relationship to the first origin position.

Figure 9:
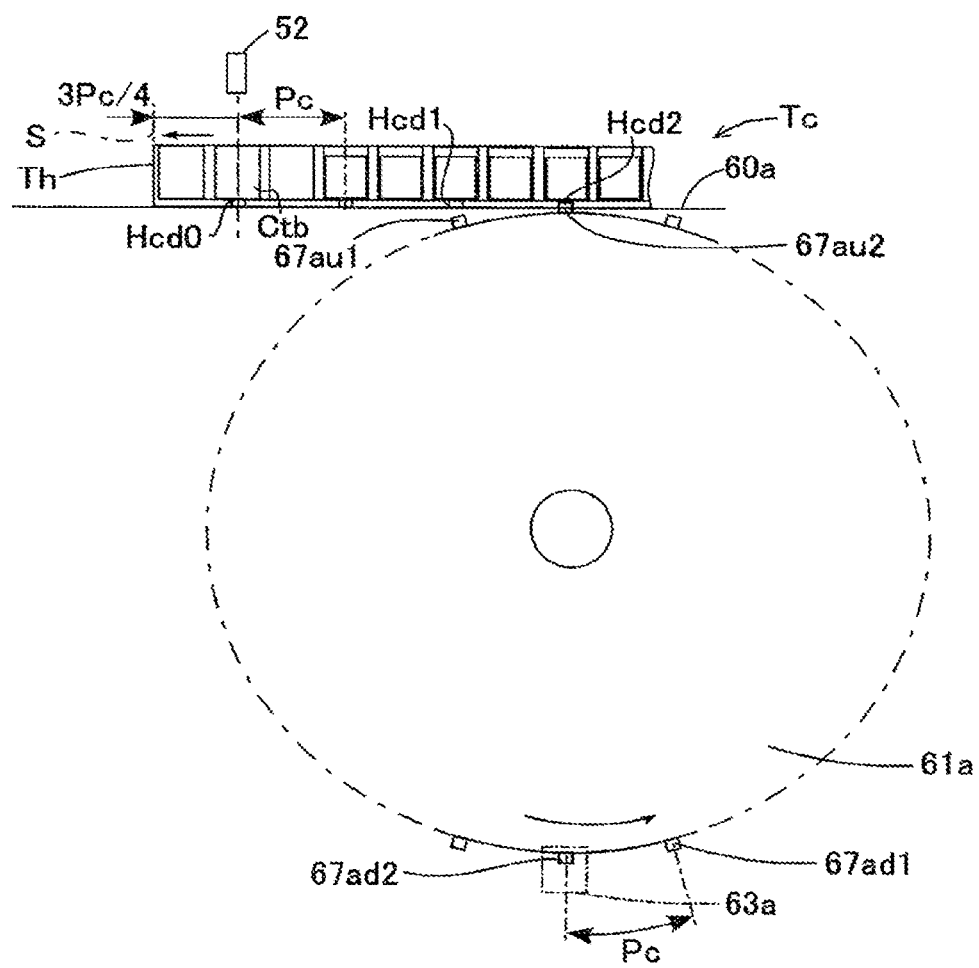
FIG. 9 shows a detection state of the origin position of first tape indexing device immediately after leading end detection, and the first sprocket and carrier tape in this state.

FIG. 9 shows a state in which carrier tape Tc is positioned at the tape reference position. In this state, lowermost first tooth 67ad2 rotated to be next after first tooth 67au1 of first sprocket 61a is detected by first origin position detection device 63a, and uppermost first tooth 67au2 rotated to be next after first tooth 67au1 of first sprocket 61a engages with engaging hole Hcd2 that is next after engaging hole Hcd1 of carrier tape Tc, leading to the shown state of detection of the origin position immediately after detection of the leading end of carrier tape Tc. The position of tape leading end Th of carrier tape Tc at this time is separated from the detection position (position of sensor light axis S) of first light amount detection device 52 by three quarters of a pitch (3Pc/4) to the conveyance downstream side. Thus, the tape reference position is the position of cavity Ctb positioned at the detection position (position of sensor light axis S) of first light amount detection device 52 and indexing hole Hcd0 formed at the same position.

Then, empty cavity Ct of carrier tape Tc is detected based on the specified threshold value of the light amount used for determining predetermined empty cavities Ct, and tape portions (portions between adjacent cavities Ct) and component-storing cavities Ct, and the pitch Pc of cavities Ct is calculated based on the detection frequency of the above. Also, in a case in which a light amount smaller than the threshold value for the light amount is detected consecutively, it is determined that the cavity Ct detected first is a component-storing cavity Ct. Accordingly, it is possible to detect the quantity of empty cavities.

Note that, in an embodiment described above, automatic splicing device 20 is configured to be capable of communication with host computer HC via communication device 40, but automatic splicing device 20 may be configured to be capable of communication individually with multiple component mounters M. Also, in an embodiment described above, automatic splicing device 20 is configured to communicate with reading device 30 via communication device 40 using wired communication, but reading device 30 may be portable, and communication may be performed via communication device 40 wirelessly. In this case, display device 40 may be configured to be provided on portable reading device 30.

Effects

Automatic splicing device 20 of the present invention is a device for automatically connecting at a splicing position using splicing tape a first tape (carrier tape) Tc provided with indexing holes Hc and component storage cavities Ct at a fixed interval Pc and a second tape (carrier tape) Tc provided with indexing holes Hc and component storage cavities Ct at a fixed interval Pc, automatic splicing device 20 including: connection control device 103 configured to control connecting of the first tape Tc and the second tape Tc and detect a quantity of empty cavities Ct at a connection position of the first tape Tc and the second tape Tc; and communication device 40 configured to send the detected quantity of empty cavities Ct to component mounter M or host computer HC connected to component mounter M such that communication is possible.

With automatic splicing device 20, it is possible to send a detected quantity of empty cavities Ct at the connection position to component mounter M or the like. By this, at component mounter M, it is possible to perform component mounting having automatically set the sent quantity of empty cavities Ct, thus preventing the occurrence of defective products.

Component mounter M of an embodiment is configured to consecutively pick up components e from carrier tape Tc supplied by tape feeder 10, mount the components e on a board, and perform control such that, when carrier tape Tc connected by automatic splicing device 20 is supplied by tape feeder 10 and the connection position of the carrier tapes Tc reaches component pickup position 12, a tape feeding speed of tape feeder 10 is made faster for a portion equivalent to the quantity of the empty cavities Ct sent by automatic splicing device 20.

With component mounter M, because it is possible to perform fast feeding of the empty cavities Ct at the connection position that are not required for component mounting, component mounting efficiency is improved.

REFERENCE SIGNS LIST

10: tape feeder; 11: reel; 12: component pickup position; 15: identifier; 20: automatic splicing device; 30: reading device; 40: communication device; 90: display device; 100: control device; 101: communication control section; 102: display control section; 103: connection performing section; W: tape connecting mechanism; M: component mounter; HC: host computer; mc: mounting control device; Tc: carrier tape; Ct: cavity

The invention claimed is:

1. An automatic splicing device for automatically connecting at a splicing position using splicing tape a first tape provided with indexing holes and component storage cavities at a fixed interval and a second tape provided with indexing holes and component storage cavities at a fixed interval, the automatic splicing device comprising:
    a connection control device configured to control connecting of the first tape and the second tape and detect a quantity of empty cavities at a connection position of the first tape and the second tape; and
    a communication device configured to send the detected quantity of empty cavities to a component mounter or a host computer connected to the component mounter such that the quantity of empty cavities at the connection portion of the first tape and the second tape is automatically set at the component mounter.

2. The automatic splicing device of claim 1, wherein the communication device is configured to send tape identification information of a first reel and a second reel to the component mounter or the host computer connected to the component mounter, the first tape being wound on the first reel and the second tape being wrapped on the second reel, and to send the detected quantity of empty cavities when tape identification information is verified.

* * * * *